United States Patent [19]

Yukawa

[11] Patent Number: 5,206,648
[45] Date of Patent: Apr. 27, 1993

[54] OVERSAMPLING DA CONVERTER WITH OPERATIONAL AMPLIFIER DRIVEN BY A SINGLE REFERENCE VOLTAGE

[75] Inventor: Akira Yukawa, Tokyo, Japan

[73] Assignee: NEC Corporation, Tokyo, Japan

[21] Appl. No.: 822,956

[22] Filed: Jan. 21, 1992

[30] Foreign Application Priority Data

Jan. 18, 1991 [JP] Japan .................................. 3-004194

[51] Int. Cl.[5] ............................................. H03M 3/00
[52] U.S. Cl. ..................................... 341/143; 341/150
[58] Field of Search ....................... 341/143, 150, 172; 333/173

[56] References Cited

U.S. PATENT DOCUMENTS

| | | | |
|---|---|---|---|
| 4,622,536 | 11/1986 | Shih et al. | |
| 4,862,121 | 8/1989 | Hochschild et al. | 333/173 |
| 4,988,900 | 1/1991 | Fensch | 341/150 X |
| 5,012,245 | 4/1991 | Scott et al. | 341/150 |
| 5,072,219 | 12/1991 | Boutaud et al. | 341/150 |
| 5,134,402 | 7/1992 | Miyoshi | 341/143 X |

OTHER PUBLICATIONS

Naus, Peter J. A., et al., "A CMOS Stereo 16-bit D/A Converter for Digital Audio," *IEEE Journal of Solid State Circuits*, vol. SC-22, No. 3, Jun. 1987, pp. 380-395.

Primary Examiner—Howard L. Williams

[57] ABSTRACT

In an oversampling digital-to-analog converter, an input 16-bit word digital signal is oversampled and quantized by a delta-sigma modulator into one of discrete values of +1, 0 and −1. A leaky integrator is coupled between the input and output terminals of an operational amplifier. A capacitor is charged by drawing a unit charge from a reference voltage source during a first half of the sample period of the +1 discrete value and discharged by injecting a unit charge to the input terminal of the operational amplifier during a second half of the sample period of the +1 discrete value. The capacitor is discharged during a first half of the sample period of the −1 discrete value and charged by drawing a unit charge from the input terminal of the operational amplifier during a second half of the sample period of the −1 discrete value. During the sample period of the 0 discrete value, the capacitor maintains a condition that occurs therein during the second half of the sample period of either of the +1 or −1 discrete value.

8 Claims, 7 Drawing Sheets

OVERSAMPLING DA CONVERTER WITH OPERATIONAL AMPLIFIER DRIVEN BY A SINGLE REFERENCE VOLTAGE

BACKGROUND OF THE INVENTION

The present invention relates generally to digital-to-analog converters, and more particularly to an oversampling digital-to-analog converter using a delta-sigma demodulator.

As described in a paper titled "A CMOS Stereo 16-bit D/A Converter for Digital Audio", Peter J. A. Naus et al, IEEE Journal of Solid-state Circuits, Vol. SC-22, No. 3, June 1987, pages 380–395, known oversampling digital-to-analog converter includes an oversampling section in which for sampling 16-bit PCM 44.1-kHz ($f_S$) parallel input data is sampled at 11.2896 MHz so that the sample rate is increased to 256$f_S$. The word length is reduced to 1 bit by a noise-shaping code conversion section (or delta-sigma modulator) and the 1-bit code passes through a 1-bit D/A converter. A small analog post-filter completes the D/A conversion of the original 16-bit PCM signal. The 1-bit D/A converter comprises a switched-capacitor circuit which modulates a reference voltage with the output of the noise-shaper, an operational amplifier for amplifying the modulated reference DC voltage through a leaky integrator that feeds back the amplified signal to the input of the amplifier. Although a distortion of 90 dB was obtained, the prior art D/A conversion technique fails to attain the level of 16-bit resolution since this level of resolution requires twice as much high sampling rate. However, the increase in sampling rate represents an increase in power consumption and difficulties in circuit design.

It is also known that the performance of an oversampling D/A converter can be improved by increasing the number of discrete threshold levels of the comparator of the delta signal modulator, instead 1 of increasing the sampling rate. For example, two reference voltage sources would be required for generating positive and negative voltages of the same value if the comparator is designed to produce a three-valued output. However, if the absolute values of the reference voltages are not equal to each other, the difference between the reference voltages would represent a signal distortion.

SUMMARY OF THE INVENTION

It is therefore an object of the present invention to provide an oversampling digital-to-analog converter whose linear characteristic is less dependent on components precision and which can be implemented in a space comparable with conventional two-valued D/A converters.

It is a further object of this invention to provide an oversampling digital-to-analog converter having an 18-bit equivalent resolution capability without increasing the sampling rate.

According to the present invention, there is provided an oversampling digital-to-analog converter which comprises an oversampling section for oversampling a digital signal which is quantized by a delta-sigma modulator into one of discrete values of +1, 0 and −1. A leaky integrator is coupled between the input and output terminals of an operational amplifier. A capacitor is charged by drawing a unit charge from a reference voltage source during a first half of the sample period of the +1 discrete value and discharged by injecting a unit charge to the input terminal of the operational amplifier during a second half of the sample period of the +1 discrete value. The capacitor is discharged during a first half of the sample period of the −1 discrete value and charged by drawing a unit charge from the input terminal of the operational amplifier during a second half of the sample period of the −1 discrete value. During the sample period of the 0 discrete value, the capacitor maintains a condition that occurs therein during the second half of the sample period of either of the +1 or −1 discrete value.

According to a second aspect of this invention, a balanced operational amplifier is employed to take the feedthrough noise advantage of the amplifier. A first leaky integrator is coupled between the first input terminal and first output terminal of the balanced operational amplifier and a second leaky integrator is coupled between the second input terminal and second output terminal of the balanced operational amplifier. First and second capacitors are provided. During a first half of the sample period of the +1 discrete value, the first capacitor is charged by drawing a unit charge from the reference voltage source and during a second half of the sample period of the +1 discrete value it is discharged by injecting a unit charge to the first input terminal of the operational amplifier. During a first half of the sample period of the −1 discrete value, the first capacitor is discharged and during a second half of the sample period of the −1 discrete value it is charged by drawing a unit charge from the reference voltage source and injecting the charge to the second input terminal of the operational amplifier. The second capacitor is discharged during the first half of the sample period of the +1 discrete value and charged by drawing a unit charge from the reference voltage source and injecting the charge to the second input terminal of the operational amplifier during the second half of the sample period of said +1 discrete value. The second capacitor is charged by drawing a unit charge from the reference voltage source during the first half of the sample period of the −1 discrete value and discharged by drawing a unit charge from the first input terminal of the operational amplifier during the second half of the sample period of the −1 discrete value. During the sample period of a 0 discrete value, each of the first and second capacitors maintains a condition that occurs therein during the second half of the sample period of either of the +1 or −1 discrete value.

According to a further aspect of this invention, the direction of charge of the first capacitor and the direction of discharge of the second capacitor are interchanged between the first and second input terminals of the operational amplifier during the second half period of +1 and −1 samples to minimize the effect which might be caused by undesired variabilities between the period for a +1 sample and the period for a −1 sample.

BRIEF DESCRIPTION OF THE DRAWINGS

The present invention will be described in further detail with reference to the accompanying drawings, in which.

DETAILED DESCRIPTION

Figure 1:
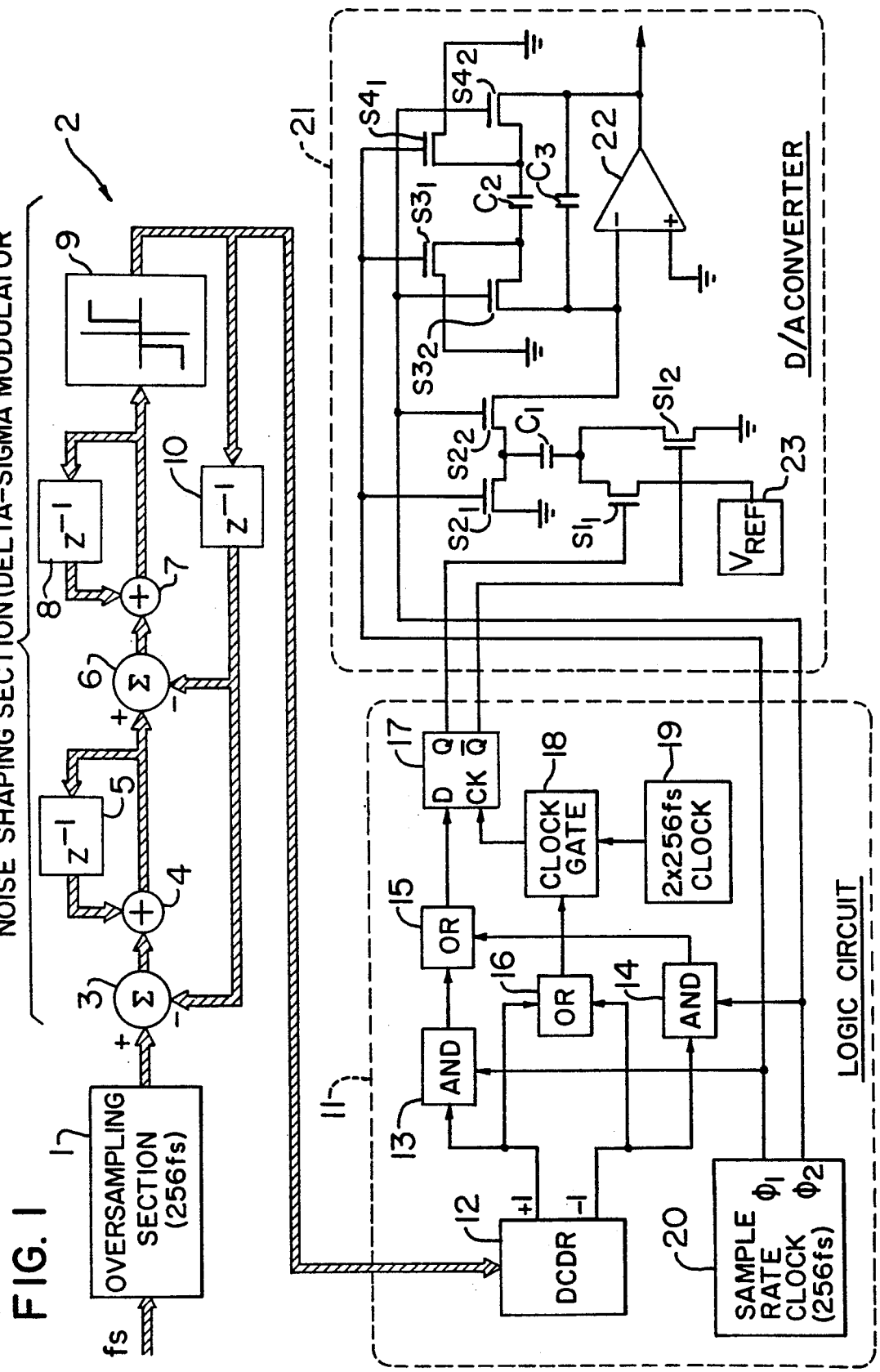
FIG. 1 is a block diagram of an oversampling digital-to-analog converter according to a first embodiment of the present invention.

Referring now to FIG. 1, there is shown an oversampling digital-to-analog converter according to the present invention. A 16-bit PCM 44.1kHz ($f_s$) parallel input data is applied to an oversampling section 1 in which it is sampled at 11.2896 MHz so that its sample rate is increased to 256 $f_s$, producing 256 samples of 16-bit parallel data for each 16-bit input sample. With this oversampling, the quantization noise spectrum extends beyond the spectrum of the input signal, and thus, only a fraction of the noise exists in the signal spectrum. The output of oversampling section 1 is so determined that the digitally equivalent of its amplitude is within the range of +1 and −1 and applied to a noise shaping section which is constructed of a 16-bit second-order delta-sigma modulator of a known construction.

As illustrated, the delta-sigma modulator comprises a first-stage digital subtractor 3 to which the oversampled parallel data is applied. The output of subtractor 3 is coupled to a first-stage integrator formed by an adder 4 and a register 5 connected in a feedback loop. The output of the first-stage integrator is derived from adder 4 and applied to a second-stage subtractor 6 the output of which is applied to a second-stage integrator comprising an adder 7 and a register 8 forming a feedback loop with adder 7. The output of the second-stage integrator is applied to a three-valued comparator 9. Comparator 9 makes decisions at the 256fs clock rate as to whether the second-stage integrator output is higher or lower than 16-bit representations of +0.5 and −0.5 and produces a 16-bit representation of +1 if it is equal to or higher than +0.5, a 16-bit representation of −1 if it is equal to or lower than −0.5, or a 16-bit representation of 0 if it lies between +0.5 and −0.5. These decisions are fed serially back through a register 10 to subtractors 3 and 6. Registers 5, 8 and 10 are all driven at 256fs clock rate to synchronize with the input oversampled data to successively introduce a delay time corresponding to the 256fs sample period. Each of the subtractors 3 and 6 thus produces a difference signal representing a digital deviation of the input from the reference values +1, 0 and −1. Comparator 9 produces a series of +1's at the 256fs clock rate until the second-stage integrator output crosses the comparator's higher threshold and produces a series of −1's at the clock rate until the integrator output crosses the comparator's lower threshold, and produces a series of 0's when the integrator output is between the two thresholds. Thus, comparator 9 produces a series of 256 outputs for each of the original 16-bit sample (fs).

The output of delta-sigma modulator 2 is applied from comparator 9 to a logic circuit 11 which includes a decoder 11 in which the output of modulator 2 is decoded into a pulse that appears at terminal +1 when the 16-bit three-level signal has a value +1 and a pulse appearing at terminal −1 when it has a value −1. The output terminals +1 and −1 of decoder 12 are connected respectively to AND gates 13 and 14 to which sample-rate clock pulses (256fs) of opposite phases $\phi_1$ and $\phi_2$ are respectively applied from a sample rate clock source 20. The output terminals of decoder 12 are further applied through an OR gate 16 as an enable signal to a clock gate 18. The outputs of AND gates 13 and 14 are applied through an OR gate 15 to the data input of a D flip-flop 17 to which the clocking signal is supplied from a higher-frequency (2×256fs) clock source 19 via the clock gate 18 when the latter is enabled.

Figure 2:
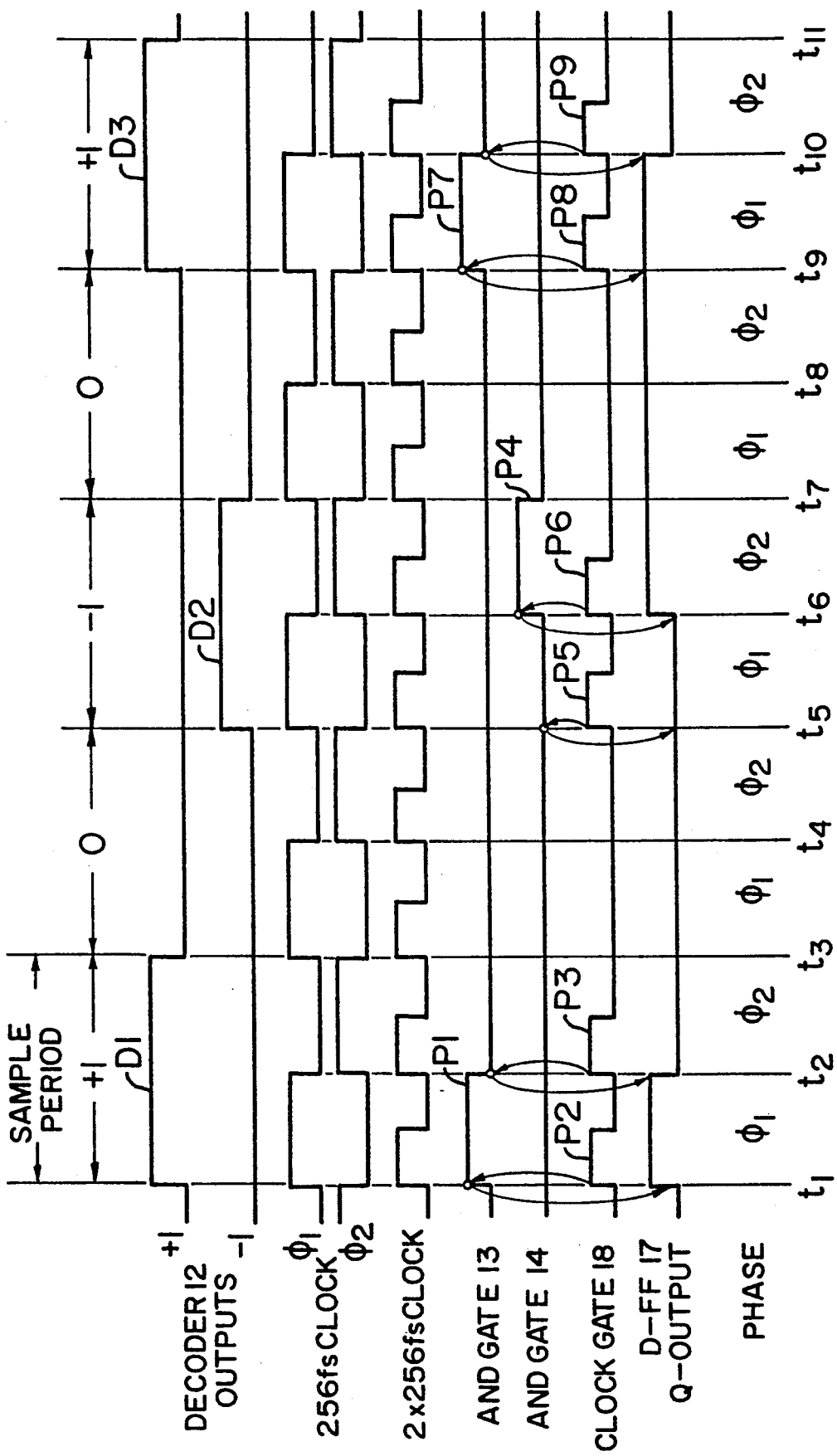
FIG. 2 is a timing diagram associated with the embodiment of FIG. 1.

As shown in FIG. 2, 256fs clock pulses from source 20 are synchronized with the output pulses from decoder 12. For an example, it is assumed that delta-sigma modulator 2 produces +1, 0, −1, 0 and +1 outputs in sequence and decoder 11, in response, produces pulses D1 and D3 at terminal +1 during interval $t_1-t_3$ and interval $t_{10}-t_{11}$, respectively, and a pulse D2 at terminal −1 during interval $t_5-t_6$. No output pulses are generated by decoder 12 during intervals $t_3-t_5$ and $t_7-t_9$ when the modulator output is 0. It is seen that AND gate 12 is enabled in response to pulse D1 from decoder 12 to pass a clock pulse P1 from 256fs clock source 20 to the data input of flip-flop 17. Clock gate 18 is also enabled by pulse D1 to pass higher-rate clock pulses P2 and P3 from source 19 to the clock input of flip-flop 17.

Therefore, at time $t_1$ the Q output of flip-flop 17 changes to a high level corresponding to the high-level data input of the flip-flop in response to the leading edge of pulse P2, and at time $t_2$ it changes to a low level corresponding to the low-level data input of the flip-flop in response to the leading edge of pulse P3. In this way, when the modulator output is +1 for a given 256fs sample period, the logic circuit 11 produces a high level output during the first half (phase $\phi_1$) of the sample period and a low level output during the second half (phase $\phi_2$) of the sample period.

In the presence of the first 0 output from the delta-sigma modulator 2 during interval $t_3-t_5$, clock gate 18 is disabled, and therefore, the low output level is maintained at the Q output of flip-flop 17.

In response to the pulse D2 from decoder 12 during the interval $t_5-t_7$, AND gate 14 is enabled to pass a clock pulse P4 from 256fs clock source 20 to the data input of flip-flop 17 during interval $t_6-t_7$ and clock gate 18 is enabled to pass higher-rate clock pulses P5 and P6 to the clock input of the flip-flop. In response to the leading edge of pulse P5, the Q output of flip-flop 17 changes to a low level corresponding to the low-level data input of the flip-flop. Since, in the illustrated example, the Q output of flip-flop 17 is in the low output state during the time prior to $t_5$, no changes occurs in the flip-flop 17 at time $t_5$. At time $t_6$ flip-flop 17 switches to a high level corresponding to the high-level data input of the flip-flop in response to the leading edge of pulse P6.

In the presence of the second 0 output from the delta-sigma modulator 2 during interval $t_7-t_9$, clock gate 18 is disabled, and the high output level is maintained at the Q output of flip-flop 17.

In response to the pulse D3 from decoder 12 during the interval $t_9-t_{11}$, AND gate 14 is enabled to pass a clock pulse P7 from 256fs clock source 20 to the data input of flip-flop 17 during interval $t_9-t_{10}$ and clock gate 18 is enabled to pass higher-rate clock pulses P8 and P9 to the clock input of the flip-flop. In response to the leading edge of pulse P8, the Q output of flip-flop 17 changes to a high level corresponding to the high-level data input of the flip-flop. Since, in the illustrated example, the Q output of flip-flop 17 is in the high output state during the time prior to $t_9$, no changes occurs in the flip-flop 17 at time $t_9$. At time $t_{10}$ flip-flop 17 switches to a low level corresponding to the low-level data input of the flip-flop in response to the leading edge of pulse P9.

The outputs of D flip-flop 17 are applied to a D/A converter 21. D/A converter 21 comprises an operational amplifier 22 having a feedback capacitor $C_3$ coupled between its summing node (negative input) and the output terminal, and a switched-capacitor circuit formed by pairs of CMOS (complementary metal-oxide semiconductor) switches $S1_i$ (i=1, 2), $S2_i$, $S3_i$, $S3_i$, and capacitors $C_1$ and $C_2$.

Capacitors $C_3$ and switched capacitor $C_3$ combine to form a leaky integrator, or low-pass filter and have the following relationships:

$$A = C_2/C_3$$

$$fc = A \times fs/2\pi$$

where A is the amplification gain of operational amplifier and fc is the cutoff frequency of the low-pass filter.

Switch $S1_1$ is responsive to the true (Q) output of flip-flop 17 for coupling a unit DC voltage $V_{REF}$ from a DC voltage source 23 to capacitor $C_1$ and switch $S1_2$ is responsive to the complementary ($\overline{Q}$) output of flip-flop 17 for coupling capacitor $C_1$ to ground. Switch $S2_1$ is responsive to the clock $\phi_1$ output of 256fs clock source 20 for coupling capacitor $C_1$ to ground and switch $S2_2$ is responsive to the clock $\phi_2$ output for coupling capacitor $C_1$ to the summing node of operational amplifier 20. Thus, switches $S2_1$ and $S2_2$ are turned on alternately during phases $\phi_1$ and $\phi_2$. Likewise, switches $S3_1$ and $S3_2$ are responsive to the clock $\phi_1$ and $\phi_2$ outputs of 256fs clock source 20, respectively, for coupling one end of capacitor $C_2$ to ground during the first half of each sample period and to the summing node of the operational amplifier 22 during the second half of the sample period. Switches $S4_1$ and $S4_2$ are responsive to the clock $\phi_1$ and $\phi_2$ outputs of 256fs clock source 20, respectively, for coupling the other end of capacitor $C_2$ to ground during the first half of each sample period and to the output terminal of the operational amplifier 22 during the second half of the sample period.

It is seen therefore that when the modulator output is +1 for a given 256fs sample period, the logic circuit 11 produces a high level output during the first half of the sample period and a low level output during the second half of the sample period, and when the modulator output is −1 for a given 256fs sample period, the logic circuit 11 produces a low level output during the first half of the sample period and a high level output during the second half of the sample period. Furthermore, when the modulator output is a 0, the output state of flip-flop 17 maintains its last binary state which occurs just prior to the occurrence of the 0 modulator output. Regardless of the operating states of switches $S1_1$ and $S1_2$, capacitor $C_2$ is discharged during the first half of the sample period and charged during the second half of the sample period.

Figure 3:
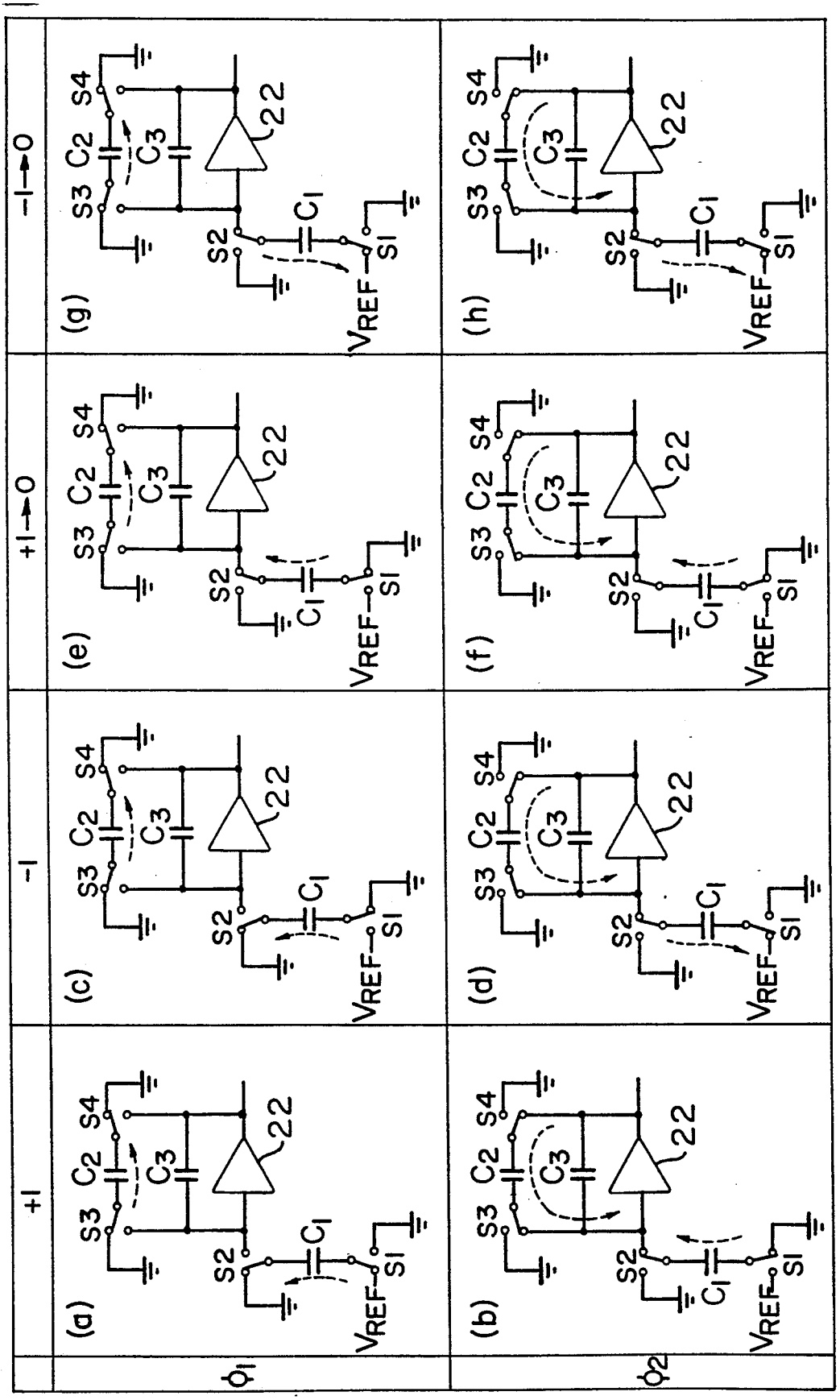
FIG. 3 is a schematic illustration of the D/A converter of FIG. 1 to describe its operation during successive phases for different modulator outputs.

The operation of the D/A converter 21 will be best understood with reference to FIG. 3 in which CMOS paired switches $Sk_i$ (k=1, 2, 3, 4) are schematically indicated by single transfer switches Sk.

If the modulator output is a +1 in a given sample period, switches S1 and S2 are moved to their left position during the first half ($\phi_1$) of the sample period and capacitor $C_1$ is charged by drawing a unit charge out of the voltage source $V_{REF}$, while switches S3 and S4 are moved to the upper position to discharge capacitor $C_2$ to ground as shown in part (a) of FIG. 3. Switches S1 and S2 are then moved to the right position during the second half ($\phi_2$) of the sample period and capacitor $C_1$ is discharged by injecting a unit charge to the summing node of the operational amplifier 22, while switches S3 and S4 are moved to the lower position to charge capacitor $C_2$ by drawing a charge from the output of operational amplifier to its summing node as shown in part (b) of FIG. 3.

If the modulator output is a −1 in a sample period, switches S1 and S2 are moved to the right and left positions, respectively, during the first half of the sample period and capacitor $C_1$ is discharged to ground, while capacitor $C_2$ is being discharged, as shown in part (c) of FIG. 3. Switches S1 and S2 are then moved to the left and right positions, respectively, during the second half of the sample period and capacitor $C_1$ is charged by drawing a unit charge out of the summing node of the operational amplifier 22, while capacitor $C_2$ is simultaneously charged by drawing a charge from the output of operational amplifier to its summing node, as shown in part (d) of FIG. 3.

If the modulator output changes from a +1 to a 0, switches S1 and S2 remain in their right position during the sample period as shown in parts (e) and (f) of FIG. 3, and capacitor $C_1$ is continuously discharged by drawing a stored charge to the summing node of the operational amplifier, while switches S3 and S4 are moved to the upper position to discharge capacitor $C_2$ to ground during the first half of the sample period and then to the lower position to charge capacitor $C_2$ during the second half of the sample period.

If the modulator output changes from a −1 to a 0, switches S1 and S2 remain in their left and right positions, respectively, during the sample period as shown in parts (g) and (h) of FIG. 3, and capacitor $C_1$ is continuously charged by drawing a unit charge out of the summing node of the operational amplifier, while switches S3 and S4 are moved to the upper position to discharge capacitor $C_2$ to ground during the first half of the sample period and then to the lower position to change capacitor $C_2$ during the second half of the sample period.

By analyzing the D/A converter 21, the following relation holds between output voltages $V_y$ and $V_{y+1}$ generated during successive sample periods:

$$V_{y+1} = \frac{C_3(A+1)V_y}{(A+1)(C_2+C_3)+C_1} + \frac{C_1 A V_x}{(A+1)(C_2+C_3)+C_1}$$

where $V_x$ is the input voltage of the converter.

Since the input voltage $V_x$ is at $+V_{REF}$ and $-V_{REF}$ for modulator outputs +1 and −1, respectively, and at 0 when the modulator output is 0, the output voltage of the converter is not adversely affected by an undesired difference between the absolute values of two reference voltage sources which would otherwise be employed.

Figure 4:
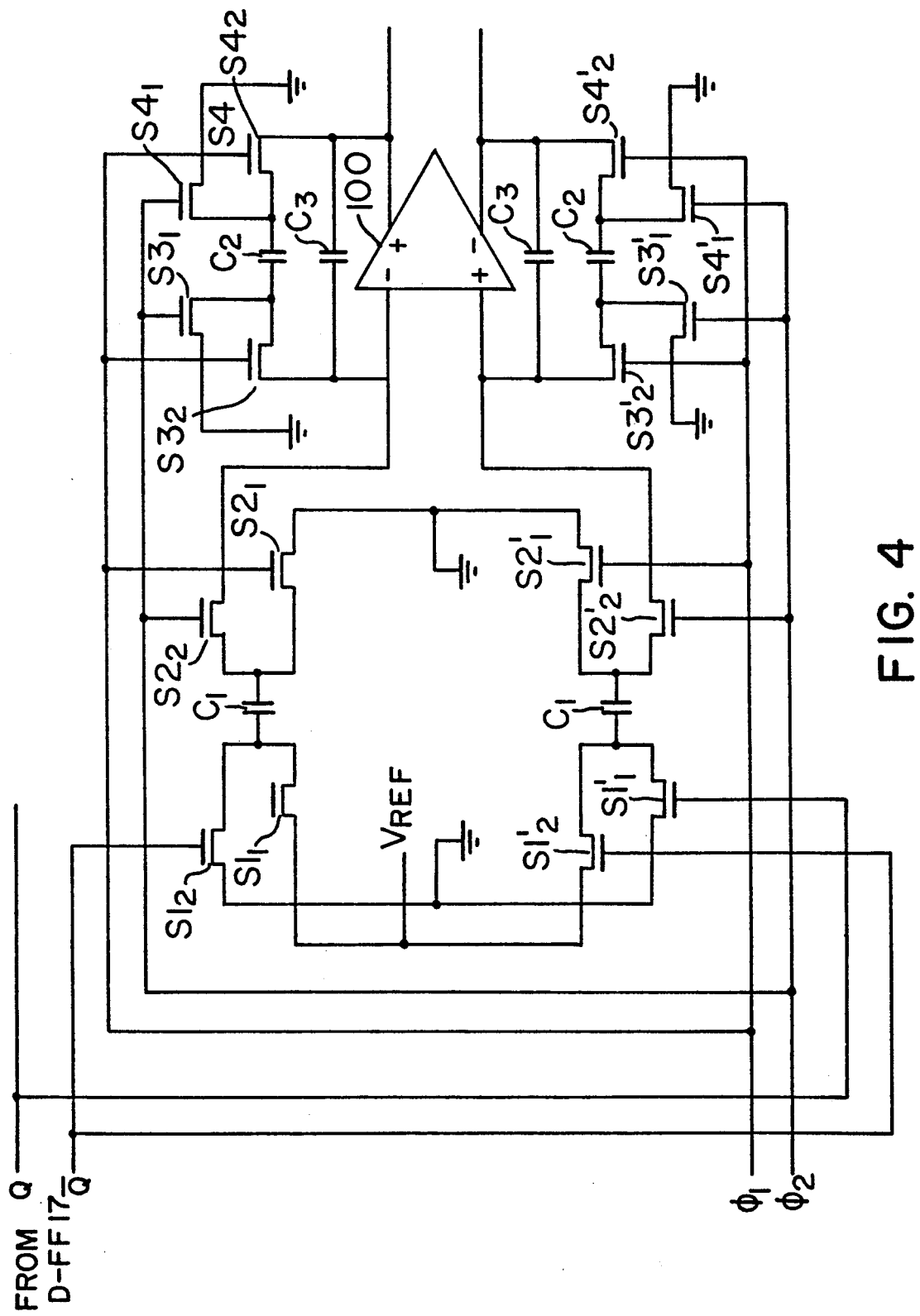
FIG. 4 is a block diagram of an oversampling digital-to-analog converter using a balanced operational amplifier.

The present invention can be applied to a balanced type operational amplifier as shown in FIG. 4 to take the feedthrough noise advantage of the amplifier. In this embodiment, CMOS switches $S2'_i$, $S3'_i$, and $S4'_i$ are provided in a symmetric configuration together with capacitors $C'_1$, $C'_2$, and $C'_3$ to one side of a balanced operational amplifier 100 with respect to those in the other side. Switches $S1'_1$ and $S1'_2$ are connected to respond to the true and complementary outputs of D flip-flop 17, respectively, for coupling ground potential and reference voltage $V_{REF}$ to capacitor $C'_1$, so that paired switches $S1_i$, and $S1'_i$ operate complementarily to each other in response to the outputs of flip-flop 17.

During the first half of the period of a +1 sample, the first capacitor $C_1$ is charged by drawing a unit charge from the reference voltage source and the second capacitor $C'_1$ is discharged. During the second half period, capacitor $C_1$ is discharged by drawing a unit charge from the negative input terminal of operational amplifier 100 and capacitor $C'_1$ is charged by drawing a unit charge from the reference voltage source and injecting the charge to the second input terminal of the operational amplifier.

During the first half of the period of a −1 sample, capacitor $C_1$ is discharged and capacitor $C'_1$ is charged by drawing a unit charge from the reference voltage source. During the second half period of the −1 sample, capacitor $C_1$ is discharged by drawing a unit charge from the reference voltage source and injecting the charge to the negative input terminal of the operational amplifier and capacitor $C'_1$ is discharged by drawing a unit charge from the positive input terminal of operational amplifier 100.

During the period of a 0 modulator sample, each of capacitors $C_1$ and $C'_1$ maintains its most recent condition.

There is a possibility that the sample period for a +1 output from the delta-sigma modulator 2 differs from the sample period for a −1 output of the modulator even though the duty ratio of the 256fs clock is maintained constant at 50% value. An embodiment shown in FIG. 5 is intended to overcome this variability problem.

Figure 5:
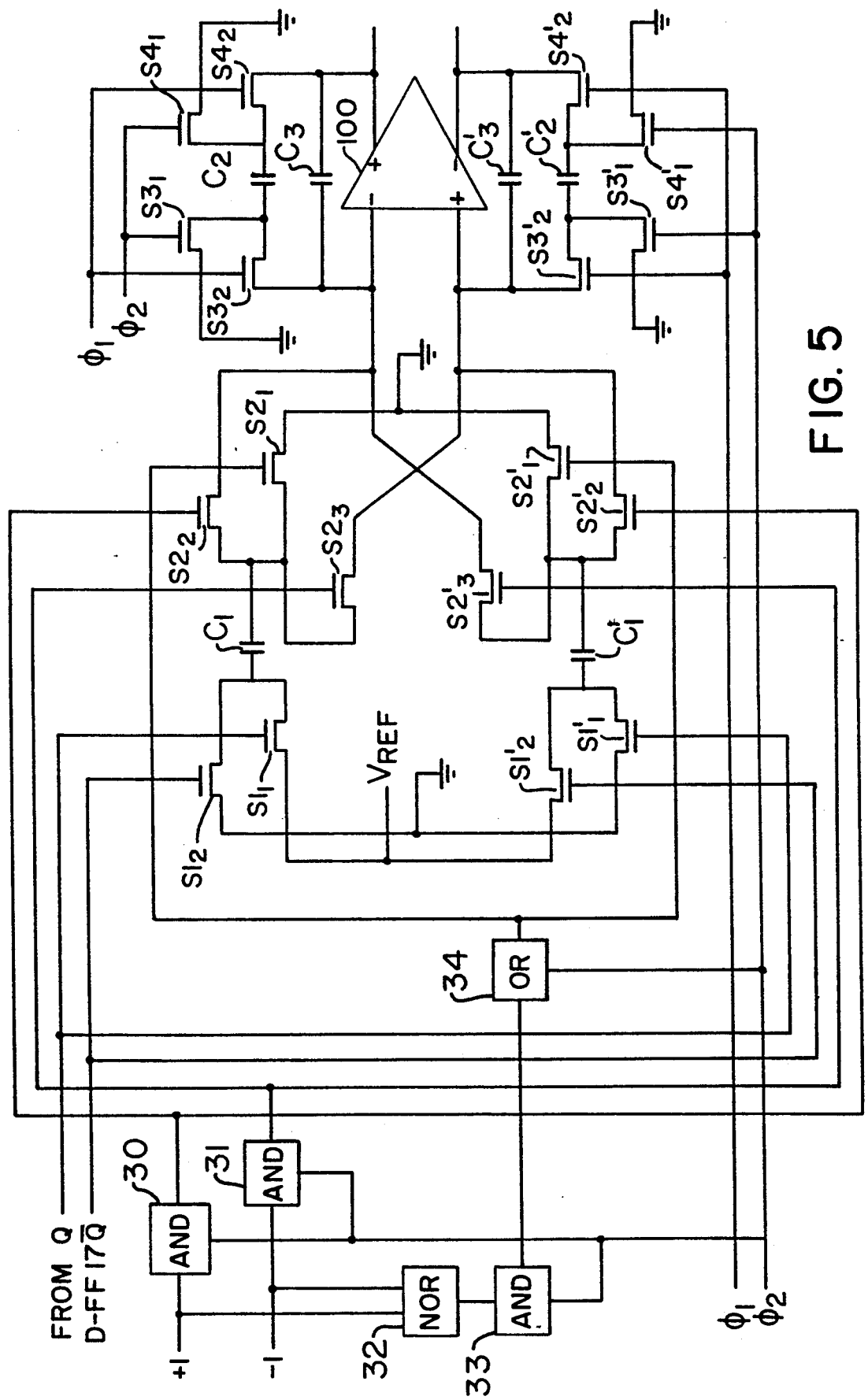
FIG. 5 is a block diagram of a modified embodiment of FIG. 4.

In FIG. 5, the D/A converter is similar to the embodiment of FIG. 4 with the exception that it includes switches $S2_1$, $S2_2$, and $S2_3$ for the positive input of operational amplifier 100 and a corresponding set of switches $S2'_1$, $S2'_2$, and $S2'_3$. Additionally included are AND gates 30 and 31 coupled to decoder 12 to respond to the +1 and −1 outputs, respectively. A NOR gate 32 is also connected to decoder 12 for supplying a logic one output representing a 0 modulator output to an AND gate 33; AND gates 30, 31 and 33 are all enabled in response to the $\phi_2$ output of the sample rate clock source 20.

The output of AND gate 30 is used to control switches $S2_2$ and $S2'_2$ for coupling capacitor $C_1$ to the negative and positive inputs of operational amplifier 100, respectively, during the second half of each sample period for a +1 modulator output, while the output of AND gate 31 controls the switches $S2_3$ and $S2'_3$ for coupling capacitor $C'_1$ to the positive and negative inputs of operational amplifier 100, respectively, during the second half of each sample period for a −1 modulator output. The output of AND gate 33 is connected via an OR gate 34 to switches $S2_1$ and $S2'_1$ for coupling capacitors $C_1$ and $C'_1$ to ground during the second half of each sample period for a 0 modulator output. Switches $S2_1$ and $S2'_1$ are also responsive to the $\phi_1$ output of sample rate clock source 20 for grounding capacitors $C_1$ and $C'_1$ during the first half of the sample period.

Figure 6A:
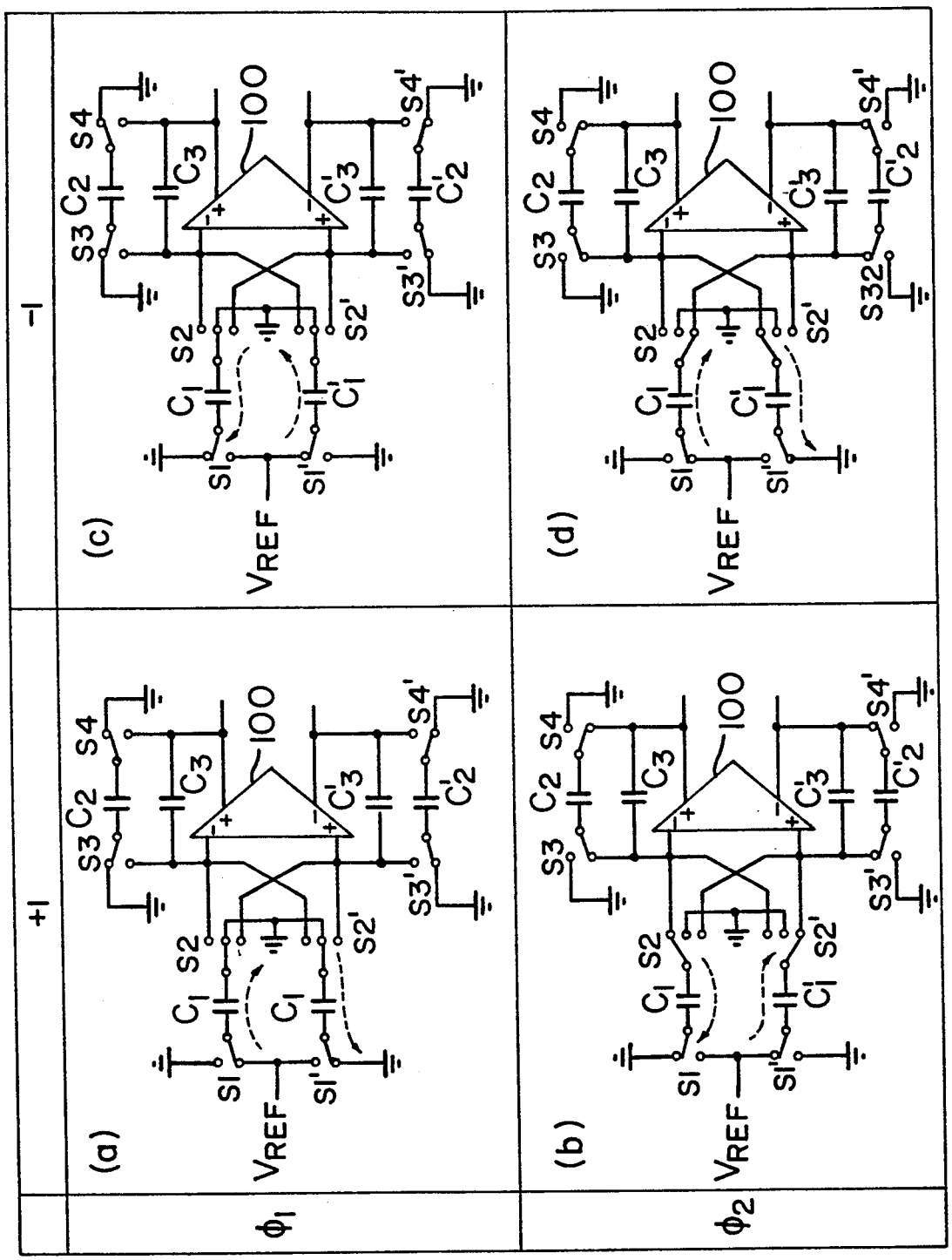
FIGS. 6A and 6B are schematic illustrations of the D/A converter of FIG. 5 to describe its operation during successive phases for different modulator outputs.
Figure 6B:
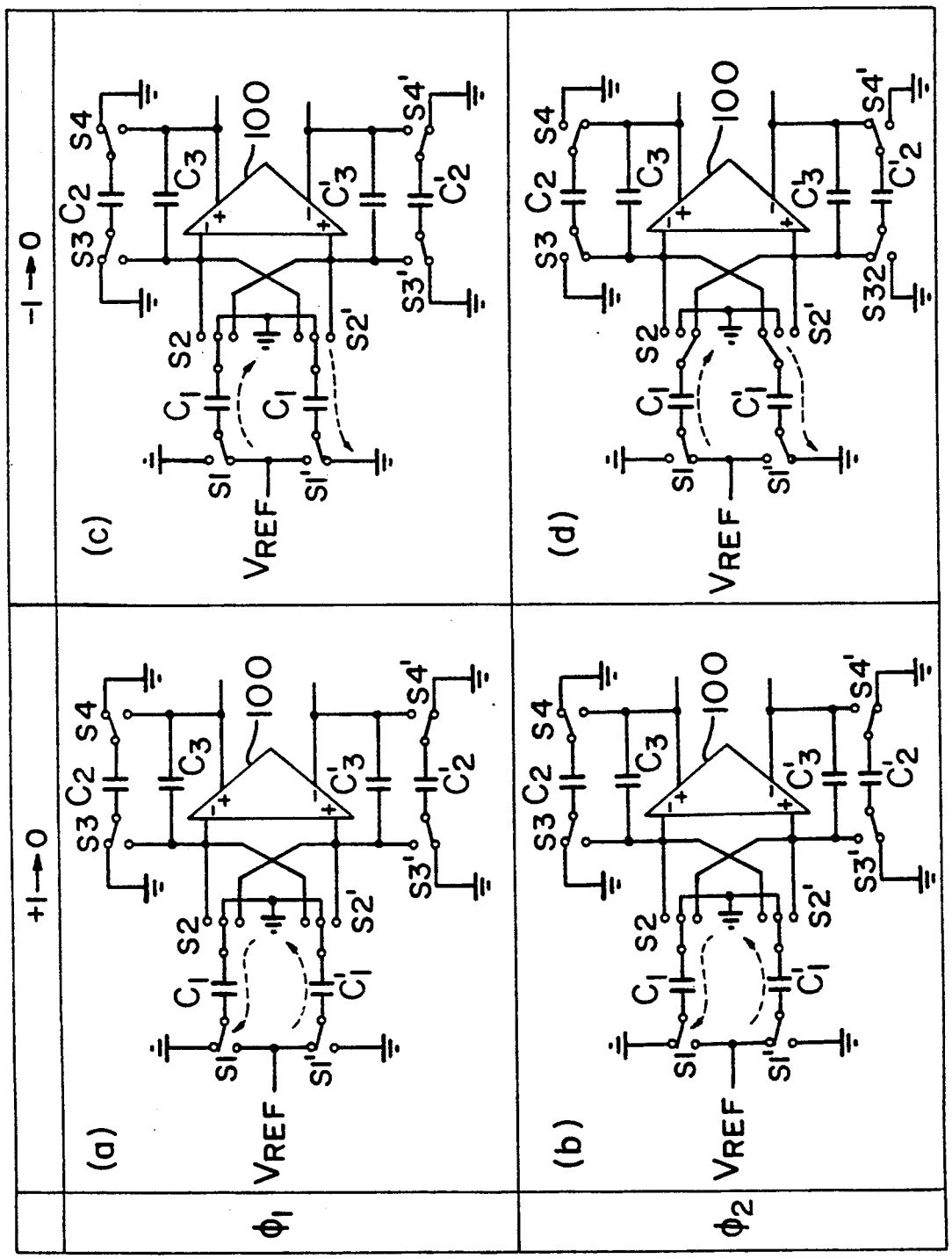

The operation of the D/A converter of FIG. 5 will best be understood with reference to FIGS. 6A and 6B. As in the embodiment of FIG. 4, switches S1 and S1' are responsive to the true and complementary outputs of D flip-flop 17. During the first half of each sample period, switches S2 and S2' are in the middle position (corresponding to switch $S2_1$ and $S2'_1$ of FIG. 5) regardless of the level of the modulator output sample.

For a +1 modulator output sample during its first half period, capacitor $C_1$ is charged by drawing a unit charge from the reference voltage source $V_{REF}$ and capacitor $C'_1$ is discharged to ground as shown in part (a) of FIG. 6A, while capacitors $C_2$ and $C'_2$ are discharged. During the second half period of the sample, capacitor $C_1$ is discharged by drawing a unit charge from the negative input of operational amplifier 100 and capacitor $C'_1$ is charged by injecting a unit charge to the positive input of the operational amplifier as shown in part (b) of FIG. 6A, while capacitors $C_2$ and $C'_2$ are charged.

For a −1 modulator output sample during its first half period, capacitor $C_1$ is discharged and capacitor $C'_1$ is charged by drawing a unit charge from the reference voltage source $V_{REF}$ as shown in part (c) of FIG. 6A, while capacitors $C_2$ and $C'_2$ are discharged. During the second half period of the sample, capacitor $C_1$ is charged by injecting a unit charge to the positive input of operational amplifier 100 and capacitor $C'_1$ is discharged by drawing a unit charge from the negative input of the operational amplifier as shown in part (d) of FIG. 6A, while capacitors $C_2$ and $C'_2$ are charged.

In response to a 0 modulator output sample that follows a previous +1 sample, capacitor $C_1$ is continuously discharged during the first half period of the 0 sample and capacitor $C'_1$ is continuously charged by drawing a unit charge from the reference voltage source as shown in part (a) of FIG. 6B, while capacitors $C_2$ and $C'_2$ are discharged. The same conditions continue during the second half period of the 0 sample as shown in part (b) of FIG. 6B, while capacitors $C_2$ and $C'_2$ are charged.

In response to a 0 modulator output sample that follows a previous −1 sample, capacitor $C_1$ is continuously charged by drawing a unit charge from the reference voltage source and capacitor $C'_1$ is continuously discharged during the first half period of the 0 sample as shown in part (c) of FIG. 6B, while capacitors $C_2$ and $C'_2$ are discharged. The same conditions continue during the second half period of the 0 sample as shown in part (d) of FIG. 6B, while capacitors $C_2$ and $C'_2$ are charged.

In this way, capacitors $C_1$ and $C'_1$ are alternately connected to the inputs of operational amplifier 100 during phase $\phi_2$ in response to +1 and −1 modulator output samples, and hence possible variations of charges injected to the operational amplifier are cancelled.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An oversampling digital-to-analog converter comprising:
    oversampling means for oversampling a digital signal to produce an oversampled digital signal;

delta-sigma modulator means for quantizing said oversampled digital signal into one of discrete values of +1, 0 and −1;

an operational amplifier and a leaky integrator coupled between input and output terminals of the operational amplifier;

a capacitor;

a reference voltage source; and logic switching means coupled to said delta-sigma modulator means and said capacitor for charging the capacitor by drawing a unit charge from said reference voltage source during a first half of the sample period of said +1 discrete value and discharging the capacitor by injecting a unit charge to the input terminal of said operational amplifier during a second half of the sample period of said +1 discrete value, for discharging the capacitor during a first half of the sample period of said −1 discrete value and charging the capacitor by drawing a unit charge from the input terminal of said operational amplifier during a second half of the sample period of said −1 discrete value, and causing said capacitor to maintain a most recent condition thereof during the sample period of said 0 discrete value.

2. An oversampling digital-to-analog converter as claimed in claim 1, wherein said leaky integrator comprises a switched capacitor circuit for discharging the capacitor thereof during the first half of the sample period of either of said +1, −1 or 0 discrete value and charging the capacitor thereof during the second half of the sample period of either of said +1, −1 or 0 discrete value.

3. An oversampling digital-to-analog converter as claimed in claim 1, wherein said logic switching means comprises:

pulse generating means for generating a first pulse sequence having a series of pulses of 50% duty cycles at said oversampling rate and a second pulse sequence having a series of pulses of 50% duty cycles at said oversampling rate, the pulses of the second pulse sequence occurring complementarily to those of the first pulse sequence;

gate means for selecting one of the pulses of the first pulse sequence in response to the +1 discrete value and selecting one of the pulses of the second pulse sequence in response to the −1 discrete value;

bistable means for generating an output signal at one of first and second discrete values depending on the binary level of an output signal from the gate means;

a first switch for coupling one end of said capacitor to said reference voltage source in response to the first discrete value of the output signal of said bistable means and coupling said one end of the capacitor to ground in response to the second discrete value of the output signal of said bistable means; and a second switch for coupling the other end of said capacitor to ground in response to said first pulse sequence and coupling said other end of the capacitor to the input terminal of said operational amplifier in response to the second pulse sequence.

4. An oversampling digital-to-analog converter comprising:

oversampling means for oversampling a digital signal to produce an oversampled digital signal;

delta-sigma modulator means for quantizing said oversampled digital signal into one of discrete values of +1, 0 and −1;

a balanced operational amplifier having first and second input terminals and first and second output terminals;

a first leaky integrator coupled between the first input terminal and first output terminal of the balanced operational amplifier and a second leaky integrator coupled between the second input terminal and second output terminal of the balanced operational amplifier;

first and second capacitors;

a reference voltage source; and logic switching means coupled to said delta-sigma modulator means and said first and second capacitors for: (a) charging said first capacitor by drawing a unit charge from said reference voltage source during a first half of the sample period of said +1 discrete value and discharging said first capacitor by drawing a unit charge from the first input terminal of said operational amplifier during a second half of the sample period of said +1 discrete value; (b) discharging said first capacitor during a first half of the sample period of said −1 discrete value and charging the first capacitor by drawing a unit charge from the reference voltage source and injecting the charge to the first input terminal of said operational amplifier during a second half of the sample period of said −1 discrete value; (c) discharging said second capacitor during the first half of the sample period of said +1 discrete value and charging said second capacitor by drawing a unit charge from the reference voltage source and injecting the charge to the second input terminal of said operational amplifier during the second half of the sample period of said +1 discrete value; (d) charging said second capacitor by drawing a unit charge from the reference voltage source during the first half of the sample period of said −1 discrete value and discharging the second capacitor by drawing a unit charge from the second input terminal of said operational amplifier during the second half of the sample period of said −1 discrete value; and (e) causing each of said first and second capacitors to maintain a most recent condition thereof during the sample period of said 0 discrete value.

5. An oversampling digital-to-analog converter as claimed in claim 4, wherein each of said first and second leaky integrators comprises a switched capacitor circuit for discharging the capacitor thereof during the first half of the sample period of either of said +1, −1 or 0 discrete value and charging the capacitor thereof during the second half of the sample period of either of said +1, −1 or 0 discrete value.

6. An oversampling digital-to-analog converter as claimed in claim 4, wherein said logic switching means comprises:

pulse generating means for generating a first pulse sequence having a series of pulses of 50% duty cycles at said oversampling rate and a second pulse sequence having a series of pulses of 50% duty cycles at said oversampling rate, the pulses of the second pulse sequence occurring complementarily to those of the first pulse sequence;

gate means for selecting one of the pulses of the first pulse sequence in response to the +1 discrete value and selecting one of the pulses of the second pulse sequence in response to the −1 discrete value; and bistable means for generating an output signal at one of first and second discrete values depending on the binary level of an output signal from the gate means;

first switch means for coupling one end of said first capacitor to said reference voltage source in response to the first discrete value of the output signal of said bistable means and coupling said one end of the first capacitor to ground in response to the second discrete value of the output signal of said bistable means;

second switch means for coupling the other end of said first capacitor to ground in response to said first pulse sequence and coupling said other end of the first capacitor to the first input terminal of said balanced operational amplifier in response to the second pulse sequence;

third switch means for coupling one end of said second capacitor to ground in response to the first discrete value of the output signal of said bistable means and coupling said one end of the second capacitor to said reference voltage source in response to the second discrete value of the output signal of said bistable means; and fourth switch means for coupling the other end of said second capacitor to ground in response to said first pulse sequence and coupling said other end of the second capacitor to the second input terminal of said balanced operational amplifier in response to the second pulse sequence.

7. An oversampling digital-to-analog converter comprising:

oversampling means for oversampling a digital signal to produce an oversampled digital signal;

delta-sigma modulator means for quantizing said oversampled digital signal into one of discrete values of +1, 0 and −1;

a balanced operational amplifier having first and second input terminals and first and second output terminals;

a first leaky integrator coupled between the first input terminal and first output terminal of the balanced operational amplifier and a second leaky integrator coupled between the second input terminal and second output terminal of the balanced operational amplifier;

first and second capacitors;

a reference voltage source; and logic switching means coupled to said delta-sigma modulator means and said first and second capacitors for: (a) charging said first capacitor by drawing a unit charge from said reference voltage source during a first half of the sample period of said +1 discrete value and discharging said first capacitor by injecting a unit charge to the first input terminal of said operational amplifier during a second half of the sample period of said +1 discrete value; (b) discharging said first capacitor during a first half of the sample period of said −1 discrete value and charging the first capacitor by drawing a unit charge from the reference voltage source and injecting the charge to the second input terminal of said operational amplifier during a second half of the sample period of said −1 discrete value; (c) discharging said second capacitor during the first half of the sample period of said +1 discrete value and charging said second capacitor by drawing a unit charge from the reference voltage source and injecting the charge to the second input terminal of said operational amplifier during the second half of the sample period of said +1 discrete value; (d) charging said second capacitor by drawing a unit charge from the reference voltage source during the first half of the sample period of said −1 discrete value and discharging the second capacitor by drawing a unit charge from the first input terminal of said operational amplifier during the second half of the sample period of said −1 discrete value; and (e) causing each of said first and second capacitors to maintain a most recent condition thereof during the sample period of said 0 discrete value.

8. An oversampling digital-to-analog converter as claimed in claim 7, wherein each of said first and second leaky integrators comprises a switched capacitor circuit for discharging the capacitor thereof during the first half of the sample period of either of said +1, −1 or 0 discrete value and charging the capacitor thereof during the second half of the sample period of either of said +1, −1 or 0 discrete value.

* * * * *